(12) United States Patent
Pahr

(10) Patent No.: US 6,600,439 B1
(45) Date of Patent: Jul. 29, 2003

(54) REFERENCE VOLTAGE CIRCUIT FOR DIFFERENTIAL ANALOG-TO-DIGITAL CONVERTER

(75) Inventor: Per Olaf Pahr, Lier (NO)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/010,685

(22) Filed: Nov. 8, 2001

Related U.S. Application Data

(60) Provisional application No. 60/247,401, filed on Nov. 8, 2000.

(51) Int. Cl.[7] .................................................. H03M 1/12
(52) U.S. Cl. ....................................... 341/158; 341/154
(58) Field of Search ................................. 341/154, 158, 341/159

(56) References Cited

U.S. PATENT DOCUMENTS

| | | | | |
|---|---|---|---|---|
| 4,496,935 A | * | 1/1985 | Inoue et al. ................ | 341/159 |
| 4,578,715 A | * | 3/1986 | Yamaguchi ................. | 358/283 |
| 6,087,970 A | | 7/2000 | Panicacci | |
| 6,191,714 B1 | | 2/2001 | Langenbacher | |
| 6,211,804 B1 | | 4/2001 | Kaplinsky | |
| 6,215,428 B1 | | 4/2001 | Fossum | |
| 6,229,469 B1 | | 5/2001 | Gaudet | |
| 6,295,013 B1 | | 9/2001 | Barna et al. | |

FOREIGN PATENT DOCUMENTS

| | | | | |
|---|---|---|---|---|
| JP | 62-111525 A | * | 5/1987 | ............ H03M/1/38 |

* cited by examiner

*Primary Examiner*—Howard L. Williams
(74) *Attorney, Agent, or Firm*—Dickstein Shapiro Morin & Oshinsky

(57) ABSTRACT

A reference voltage circuit for a differential analog-to-digital converter wherein a first reference voltage source is connected to a midpoint of a resistive ladder for the analog-to-digital converter. A master module may regulate the voltage over an auxiliary resistor connected to the first reference voltage source and to a second reference voltage source. The regulated current in the auxiliary resistor may be scaled and copied into a current which is sourced into the top of the resistive ladder and also scaled and copied into a second equal current which is sinked from the bottom of the resistive ladder. Decoupling capacitors may be placed so as to improve the power supply ripple rejection to the resistive ladder.

22 Claims, 8 Drawing Sheets

REFERENCE VOLTAGE CIRCUIT FOR DIFFERENTIAL ANALOG-TO-DIGITAL CONVERTER

CROSS REFERENCE TO RELATED APPLICATIONS

This application claims the benefit of priority from U.S. Provisional Application entitled "REFERENCE VOLTAGE CIRCUIT FOR DIFFERENTIAL ANALOG-TO-DIGITAL CONVERTER (ADC)", filed Nov. 8, 2000, application Ser. No. 60/247,401, which is hereby incorporated by reference.

BACKGROUND

The present application describes systems and techniques relating to reference voltage circuits for differential analog-to-digital converters (ADCs), for example, flash ADCs used in image sensors. An ADC is an electronic circuit that measures an analog signal, which typically represents some real-world phenomenon (e.g., temperature, pressure, incident light, acceleration, speed), and converts it to a digital signal by comparing the analog signal to a known reference voltage.

FIG. 1 is a functional block diagram illustrating a prior art design 100 for providing a differential reference voltage for an ADC. The design 100 uses a resistive ladder 102 with a differential analog input reference that may be provided by voltage controlled current sources 104. The design includes circuits with either non-regulated or regulated high and low voltages $V_{ADC\_HIGH}$, $V_{ADC\_LOW}$ set up around a common-mode voltage. The input references may be regulated by voltage regulators 106, 108, according to reference input voltages $V_{REF\_HIGH}$, $V_{REF\_LOW}$ FIG. 2 is a schematic illustrating an example circuit 200 implementing the prior art design 100 shown in FIG. 1. In FIG. 2, an amplifier AMP, regulates the voltage $V_{ADC\_HIGH}$ according to a reference input $V_{REF\_HIGH}$. An amplifier $AMP_2$ regulates the voltage $V_{ADC\_LOW}$ according to a reference input $V_{REF\_LOW}$. Resistors $R_1$, $R_2$, $R_3$, $R_4$ constitute a resistive ladder 202 for the ADC. A capacitor $C_3$ is a differentially connected decoupling capacitor for the ladder, 202. Capacitors $C_1$ and $C_2$ are phase compensating capacitors for regulators 206, 208, respectively.

SUMMARY

In one aspect, a reference voltage circuit for an analog-to-digital converter includes a resistive ladder having an even number of resistors and a midpoint between the resistors and a reference voltage source coupled to the midpoint. The resistive ladder may include four, eight, or more resistors. The reference voltage source may be a regulated voltage source that will accept both input and output currents. The reference voltage source may differ from a common-mode voltage of the analog input signal to the analog-to-digital converter by a small amount, such as by less than one half a least significant bit (½ LSB) of the analog-to-digital converter.

The reference voltage circuit may also include a reference resistor coupled with the reference voltage source, a voltage-controlled current source coupled with the reference resistor, a voltage regulator coupled with the first voltage-controlled current source, and a low voltage source coupled to the voltage regulator. The voltage regulator may be an amplifier coupled in a feedback loop with the voltage controlled current source. The reference voltage circuit may also include a current mirror coupled with a power supply, the voltage regulator, and the resistive ladder, wherein the current mirror scales current in the resistive ladder by a factor of eight. Resistance matching may be provided between the reference resistor and a total combined series resistance of the resistive ladder.

In another aspect, an analog-to-digital converter may be manufactured, such as on a semiconductor substrate, to include a reference voltage circuit having a resistive ladder and a reference voltage source connected with a midpoint of the resistive ladder. The analog-to-digital converter may also include a plurality of comparators coupled with the resistive ladder, and a digital output encoder.

In another aspect, a method includes forming on a substrate, a resistive ladder having an even number of resistors and a midpoint between the resistors, and connecting a reference voltage source to the midpoint. The method may further include forming a reference resistor on the substrate, forming a first voltage-controlled current source on the substrate, forming a voltage regulator on the substrate, connecting the reference resistor with the reference voltage source, connecting the first voltage-controlled current source with the reference resistor, and connecting the voltage regulator with the first voltage-controlled current source and with a low voltage source. The method may also include connecting an amplifier in a feedback loop with the first voltage-controlled current source, where the amplifier is the voltage regulator.

In another aspect, a method includes applying a reference voltage to a midpoint of a resistive ladder in a circuit to create a plurality of reference voltages for an analog-td-digital converter. The method may further include providing a power source for the circuit, and providing a ground for the circuit. The method may also include providing an analog input to a plurality of comparators coupled with the resistive ladder to generate a digital output.

DRAWING DESCRIPTIONS

Details of one or more embodiments are set forth in the accompanying drawings and the description below. Other features and advantages may be apparent from the description and drawings, and from the claims.

DETAILED DESCRIPTION

The systems and techniques described here relate to reference voltage circuits for differential ADCs. The description that follows discusses reference voltage circuits in the context of two-bit ADCs, but may apply equally in other contexts. For example, the reference voltage circuits described here may be implemented with larger resistive ladders and/or may be used with multiple ADCs, such as with a photo sensor built on a single chip substrate.

Figure 1:
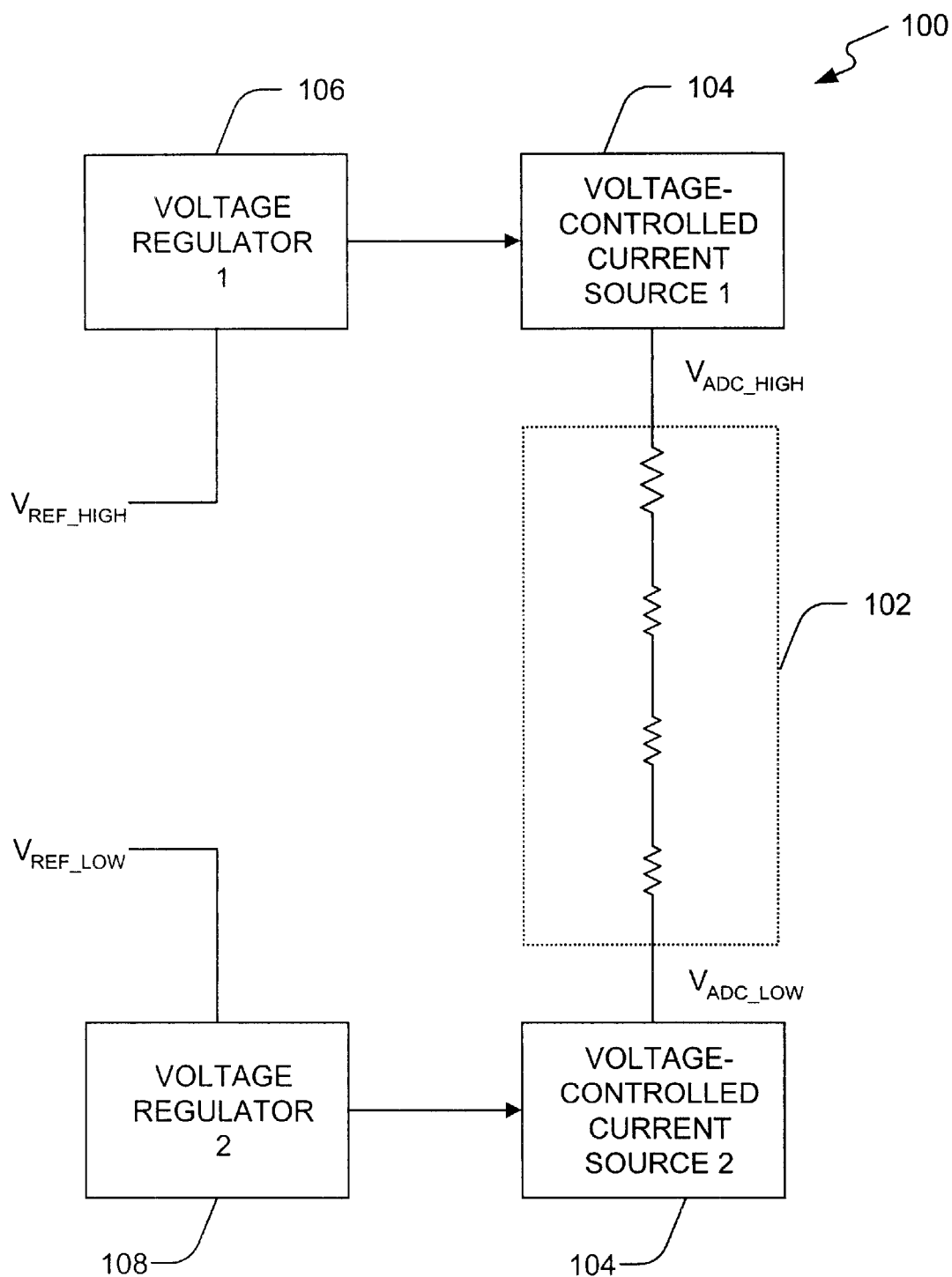
FIG. 1 is a functional block diagram illustrating a prior art design for providing a differential reference voltage for an ADC.
Figure 2:
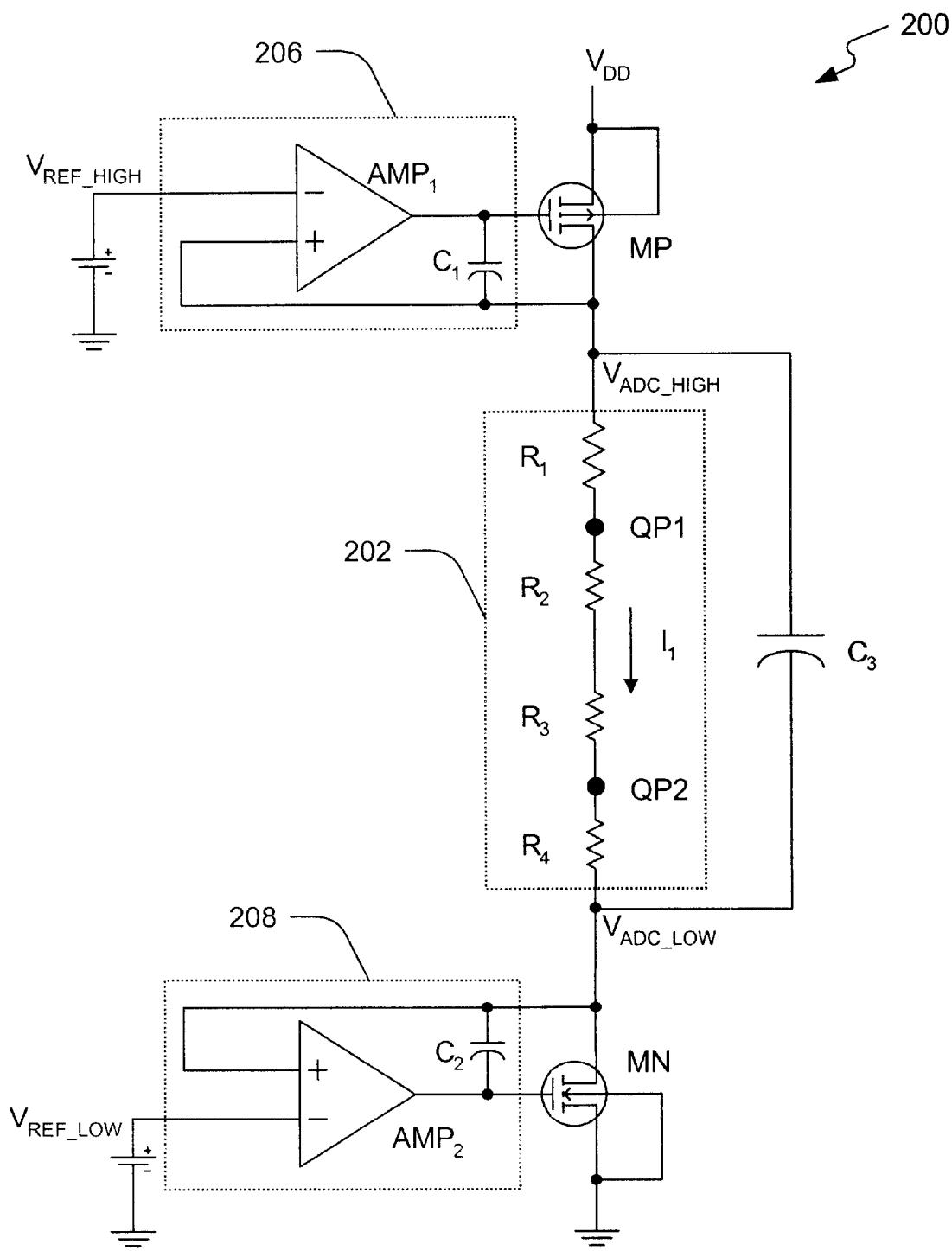
FIG. 2 is a schematic illustrating an example circuit implementing the prior art design shown in FIG. 1.

As discussed in the background section of this application, FIGS. 1 and 2 illustrate a prior art design 100 and an example circuit 200 for providing a differential reference voltage for an ADC. One of the disadvantages of the design of FIGS. 1 and 2 is poor power supply ripple rejection (PSRR). For example, referring to FIG. 2, an increase in a transient voltage on VDD may cause an increase in the current $I_1$ through the resistive ladder and a displacement current in the decoupling capacitor $C_3$. This, in turn, may cause an upper regulator 206 to decrease the current through transistor MP.

However, a lower regulator 208 also observes an upward-going voltage on the node $V_{ADC\_LOW}$. Therefore, the lower regulator 208 may try to increase the current through transistor MN and the resistive ladder 202. Hence the two regulators 206, 208 take opposite actions. Depending on the bandwidth of the two regulators, their inherent power supply ripple rejection and the frequency spectrum of the power supply noise, this regulator system may tend to amplify the power supply ripple. An ADC ladder biasing method and circuit as disclosed in this application, may have a better power supply ripple rejection.

The ladder resistors in FIG. 2 should be low-impedance so that there is a relatively low resistive path from the two quarter positions QP1, QP2 of the ladder, to the differential decoupling capacitor $C_3$. The path should also be low resistive between the two quarter positions QP1, QP2. The quarter positions QP1, QP2 represent the worst-case high impedance points that need to be decoupled properly. Therefore, there may be significant power dissipation in such a biased resistive ladder.

Figure 3:
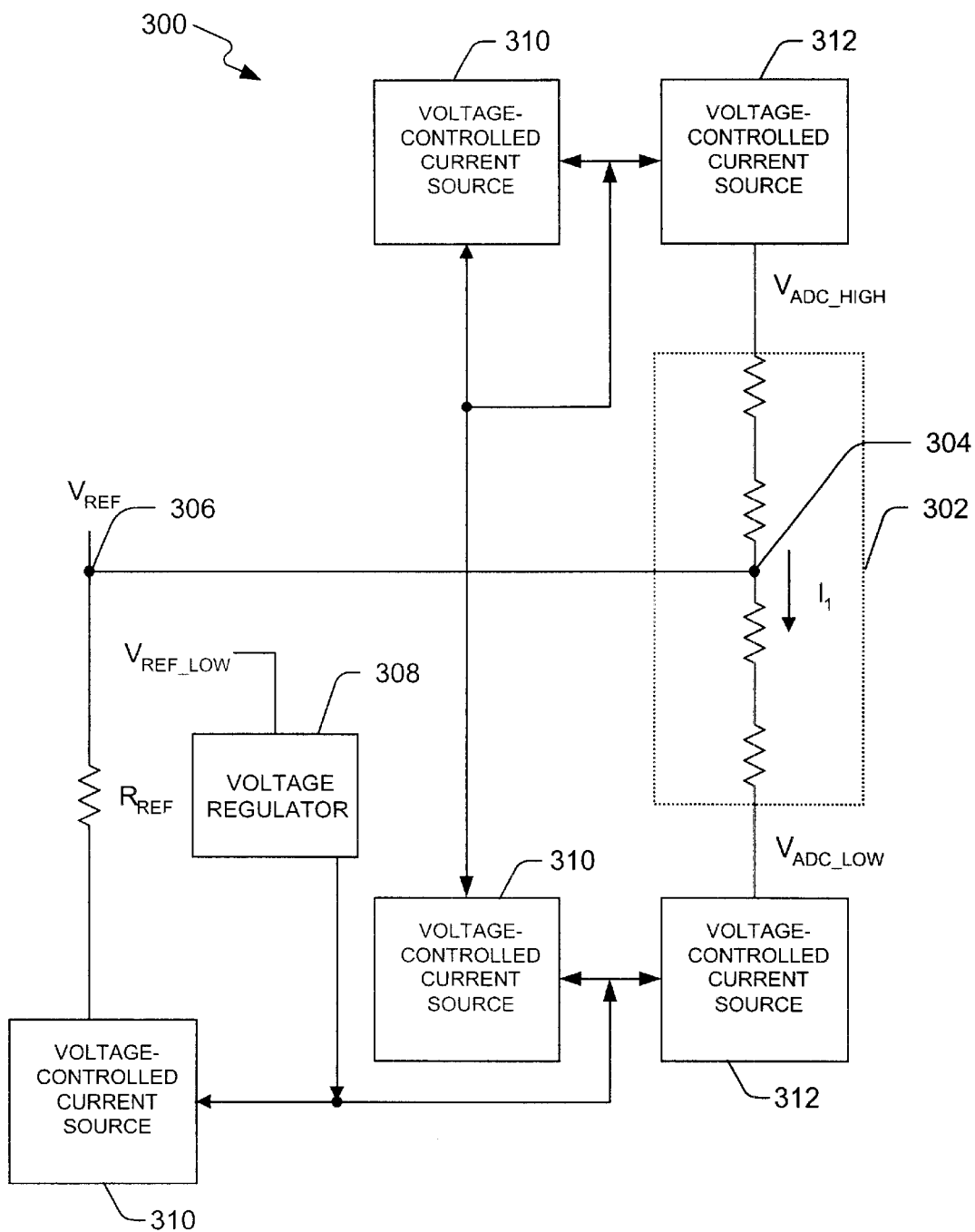
FIG. 3 is a functional block diagram illustrating a design for providing a differential reference voltage for an ADC.

FIG. 3 is a functional block diagram illustrating a design 300 for providing a differential reference voltage for an ADC. The design 300 sets up the voltage over a resistive ladder 302 by connecting the ladder's midpoint 304 to a voltage source 306 ($V_{REF}$). The voltage source 306 would typically be very close to the common-mode voltage of the differential ADC and the signal amplifier(s) prior to the ADC. This voltage source 306 is preferably regulated and will accept both input and output currents.

The design 300 may include a reference resistor $R_{REF}$, a voltage regulator 308, and multiple voltage controlled current sources 310, 312. Those voltage controlled current sources 312 that are on either side of the resistive ladder 302 may be scaled by a factor of eight over the other voltage controlled current sources 310, as discussed further below. Equal currents are sourced into the top of the ladder 302 (at $V_{ADC\_HIGH}$) and sinked out of its bottom (at $V_{ADC\_LOW}$), to create a ladder current of $I_1$. Any small mismatch currents are absorbed by the midpoint voltage source 306.

Figure 4:
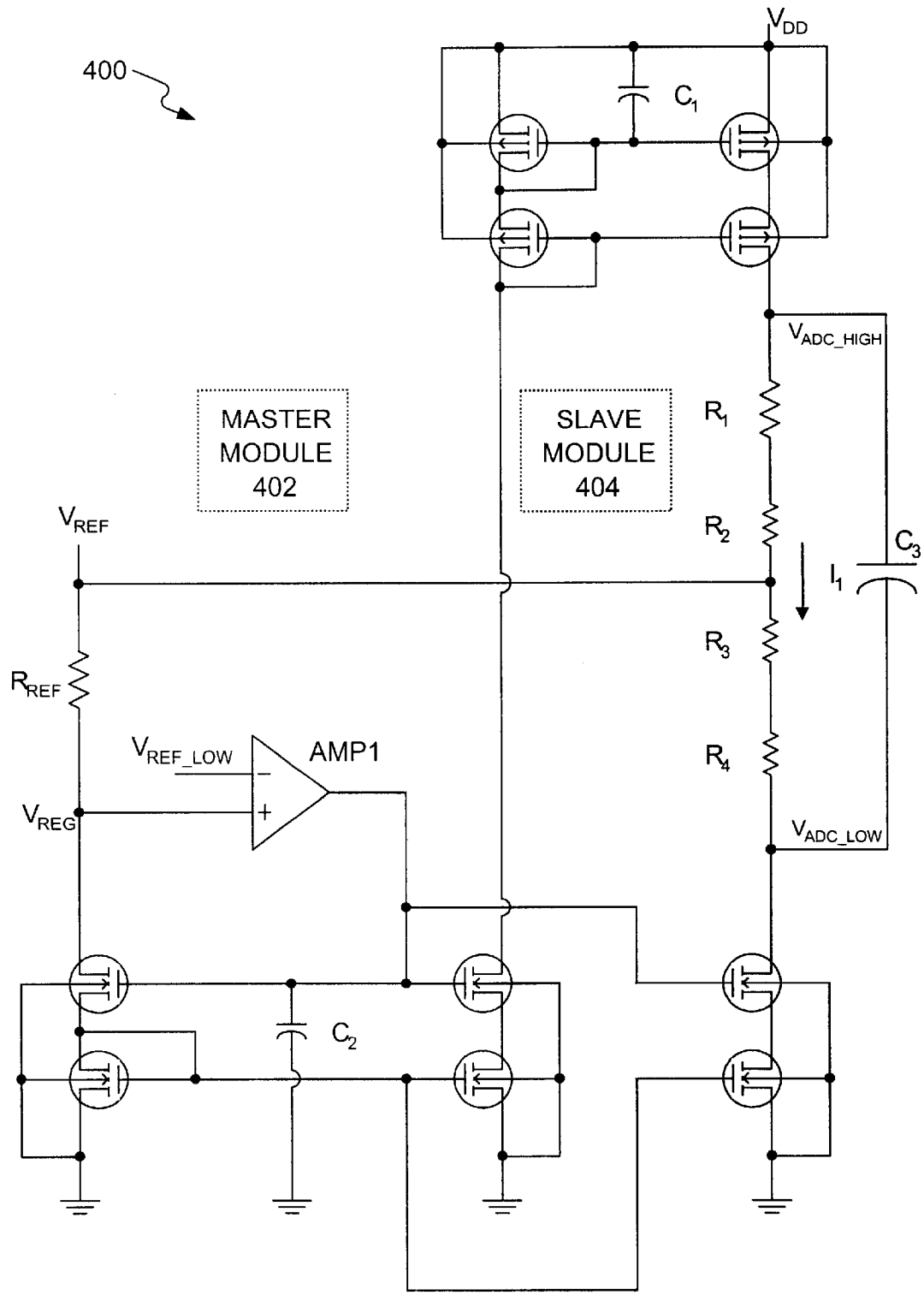
FIG. 4 is a schematic illustrating an example reference voltage circuit implementing the design shown in FIG. 3.

FIG. 4 is a schematic illustrating an example reference voltage circuit implementing the design shown in FIG. 3. The reference voltage circuit shown in FIG. 4 generally includes a master module 402 and a slave module 404. An amplifier AMP1 is configured in a feedback loop. The amplifier sets the voltage over resistor $R_{REF}$ close to one half of the effective differential ADC reference voltage:

$$V_{REG} \approx V_{REF} - V_{REF\_LOW} \tag{1}$$

In this configuration, the current $I_1$ is scaled by a factor of eight over the current sourced by the voltage $V_{REG}$. Thus, the current in the ADC ladder is:

$$I_1 = 8*(V_{REF} - V_{REF\_LOW})/(4*R_{LADDER}) \tag{2}$$

where $R_{LADDER}$ is the total combined series resistance of the ladder resistors $R_1, R_2, R_3, R_4$.

The actual differential ADC ladder voltage is:

$$V_{LADDER} = 2*(V_{REF} - V_{REF\_LOW}) \tag{3}$$

Hence, $$V_{ADC\_HIGH} = V_{REF} + \tfrac{1}{2}*V_{LADDER} \tag{4}$$

$$V_{ADC\_LOW} = V_{REF} - \tfrac{1}{2}*V_{LADDER} \tag{5}$$

Preferably the circuit 400 provides resistance matching between $R_{REF}$ and $R_{LADDRR}$. The slave voltage will be independent of global (lot-dependent) sheet resistance variations.

The circuit 400 has a lower ladder quarter-point resistance than the prior art design of FIGS. 1 and 2. Since the midpoint VREF is regulated, it has close to zero ohm resistance.. The quarter-point resistance becomes $(\tfrac{3}{4}) \times R_{QP}$. Even assuming ideal decoupling with the capacitor $C_3$ in FIG. 2, the quarter-point resistance of the circuit 200 in FIG. 2 is $R_{QP}$.

In the circuit 400 of FIG. 4, the capacitor $C_2$ is used to phase compensate the regulator. Capacitor $C_1$ is used to ensure that the power supply ripple couples to the gates of the upper current mirror. Thus, the new design 300 and circuit 400 substantially improve the PSRR.

Figure 5:
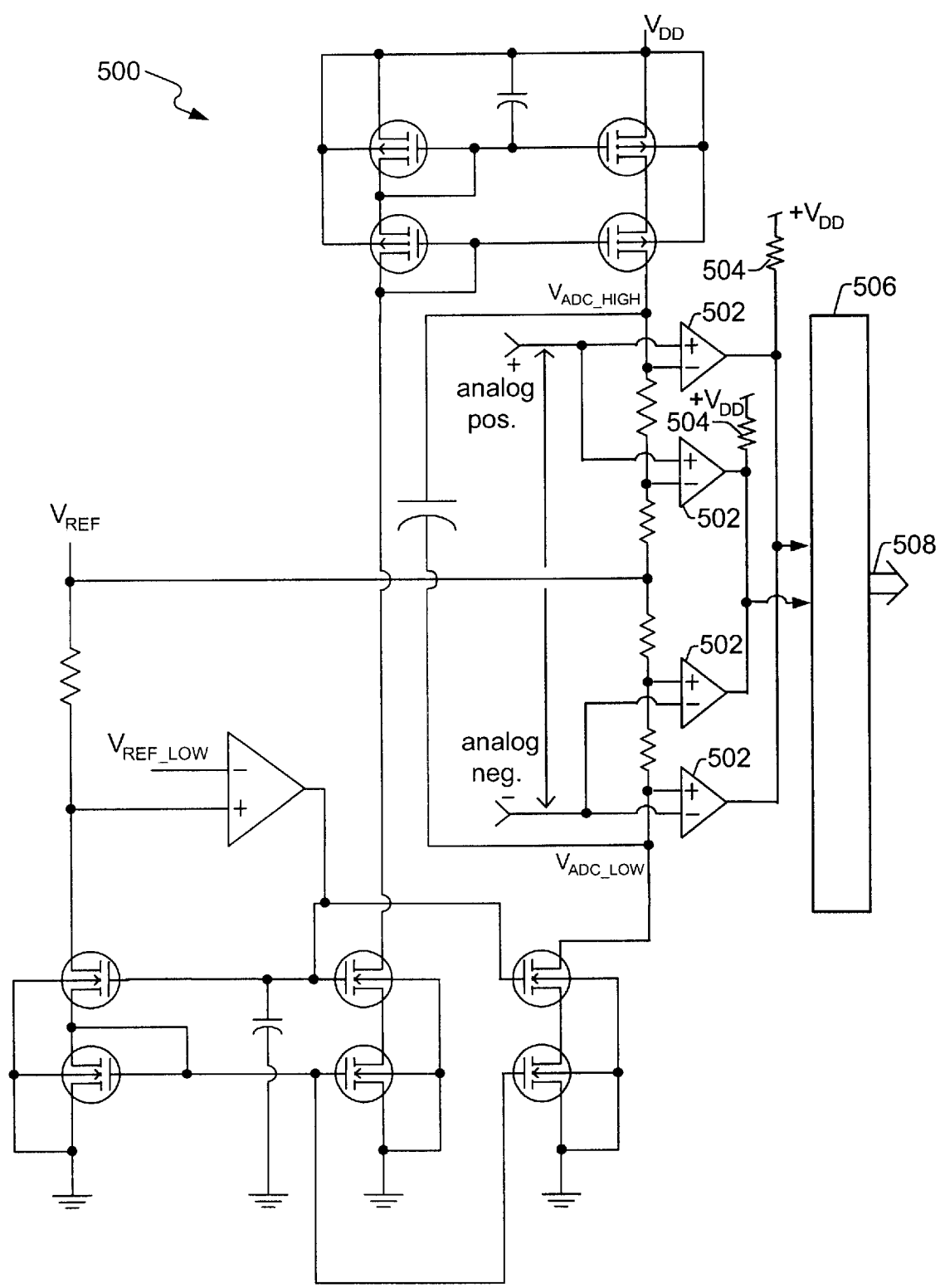
FIG. 5 is a schematic illustrating an example ADC circuit using the reference voltage circuit of FIG. 4.

FIG. 5 is a schematic illustrating an example ADC circuit 500 using the reference voltage circuit of FIG. 4. A fully differential and symmetric around the reference voltage $V_{REF}$, analog input signal between nodes "analog pos." and "analog neg." is provided, along with the reference voltages along the resistive ladder, to comparators 502. For each bit these comparators 502 are pair wise arranged, and their output currents are pair wise wire-OR'd together by resistors 504 connected to the positive power supply VDD. The output from the comparators 502 and the resistors 504 is input for a digital output encoder 506, which provides a two-bit binary output 508 corresponding to the differential analog input.

Figure 6:
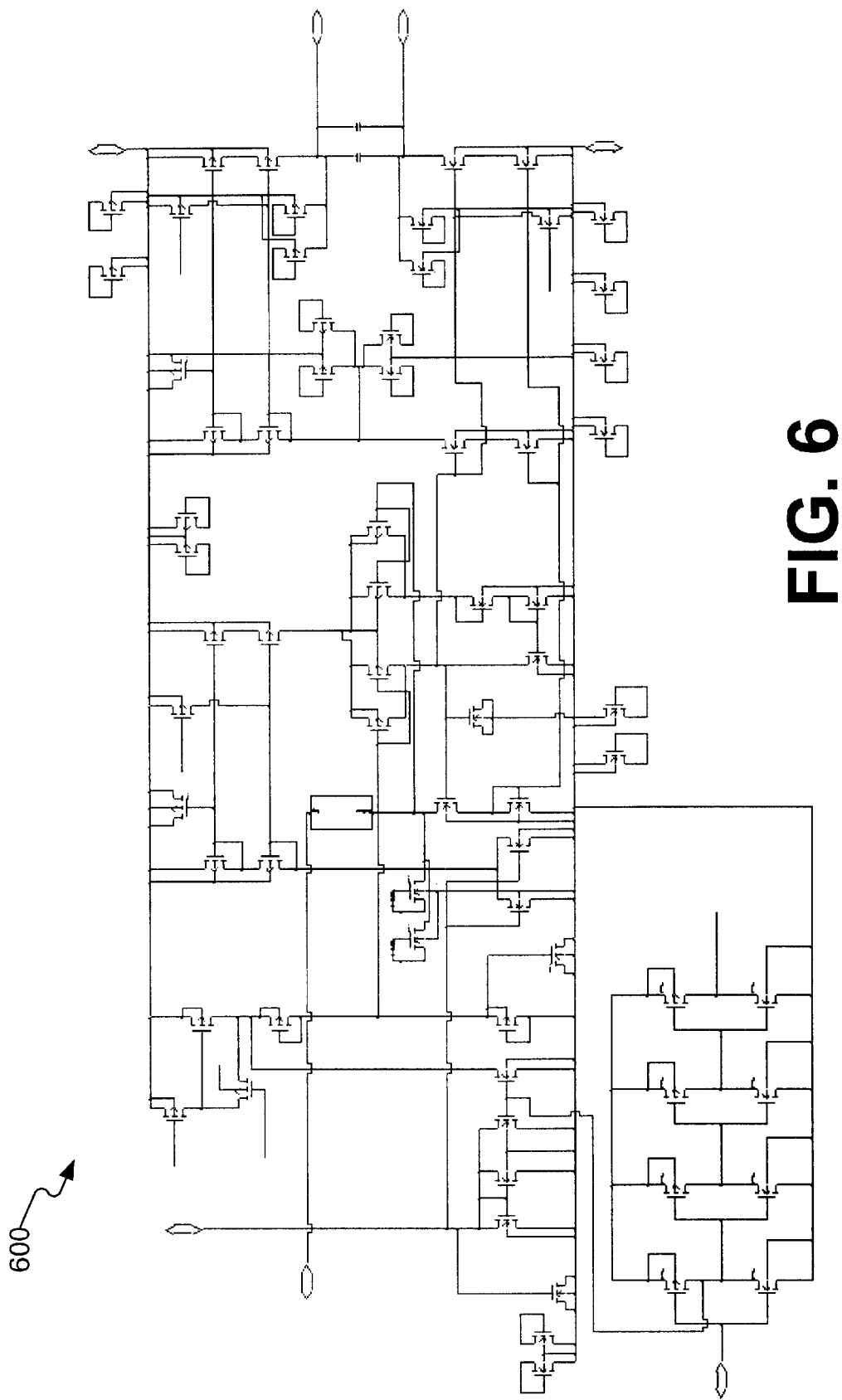
FIG. 6 is a schematic illustrating an example circuit implementing the design shown in FIG. 3.

FIG. 6 is a schematic illustrating an example circuit 600 implementing the design shown in FIG. 3. The circuit 600 includes dummy transistor structures for matching. An important design issue is the transient response time of the regulator to any changes in the input reference voltage (e.g., $V_{REF}$ from FIG. 4). Internally in an integrated circuit, such a reference voltage is typically not an ideal stiff voltage source. Thus, analog-to-digital conversion can generally only take place after a certain settling time of the voltage source regulator.

Figure 7:
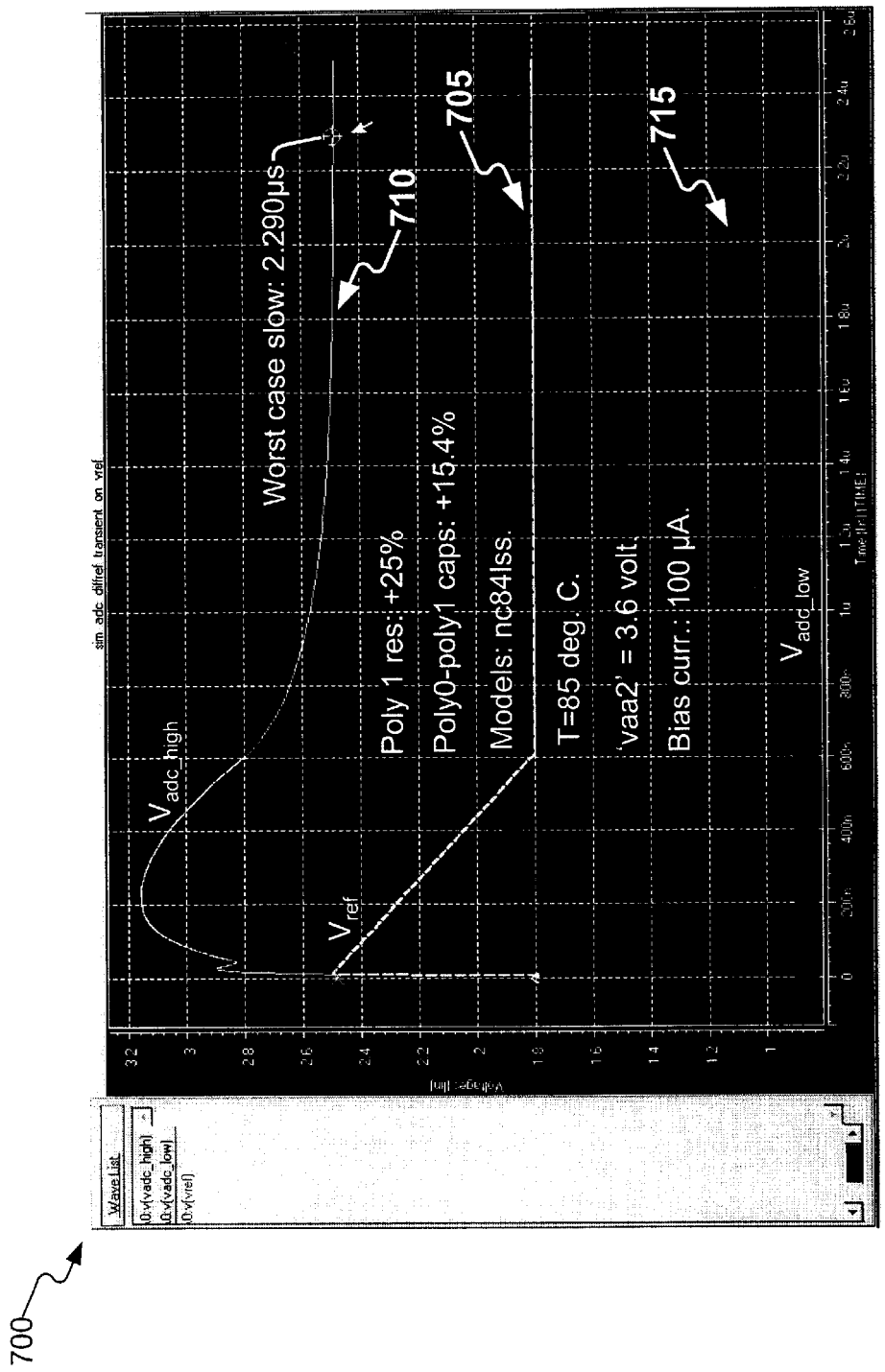
FIG. 7 is an illustration showing a graphical output display for a simulation of transient response time of the regulator in the example circuit of FIG. 6.

FIG. 7 is an illustration showing a graphical output display 700 for a simulation of transient response time of the regulator in the example circuit of FIG. 6. A typical positive triangular change in the input reference voltage $V_{ref}$ is shown as the middle waveform 705. The settling time of the regulator in the example circuit is represented by a $V_{adc\_high}$ waveform 710 and a $V_{adc\_low}$ waveform 715. As can be seen in FIG. 7, the settling time of this example circuit is 2.24 µs.

Figure 8:
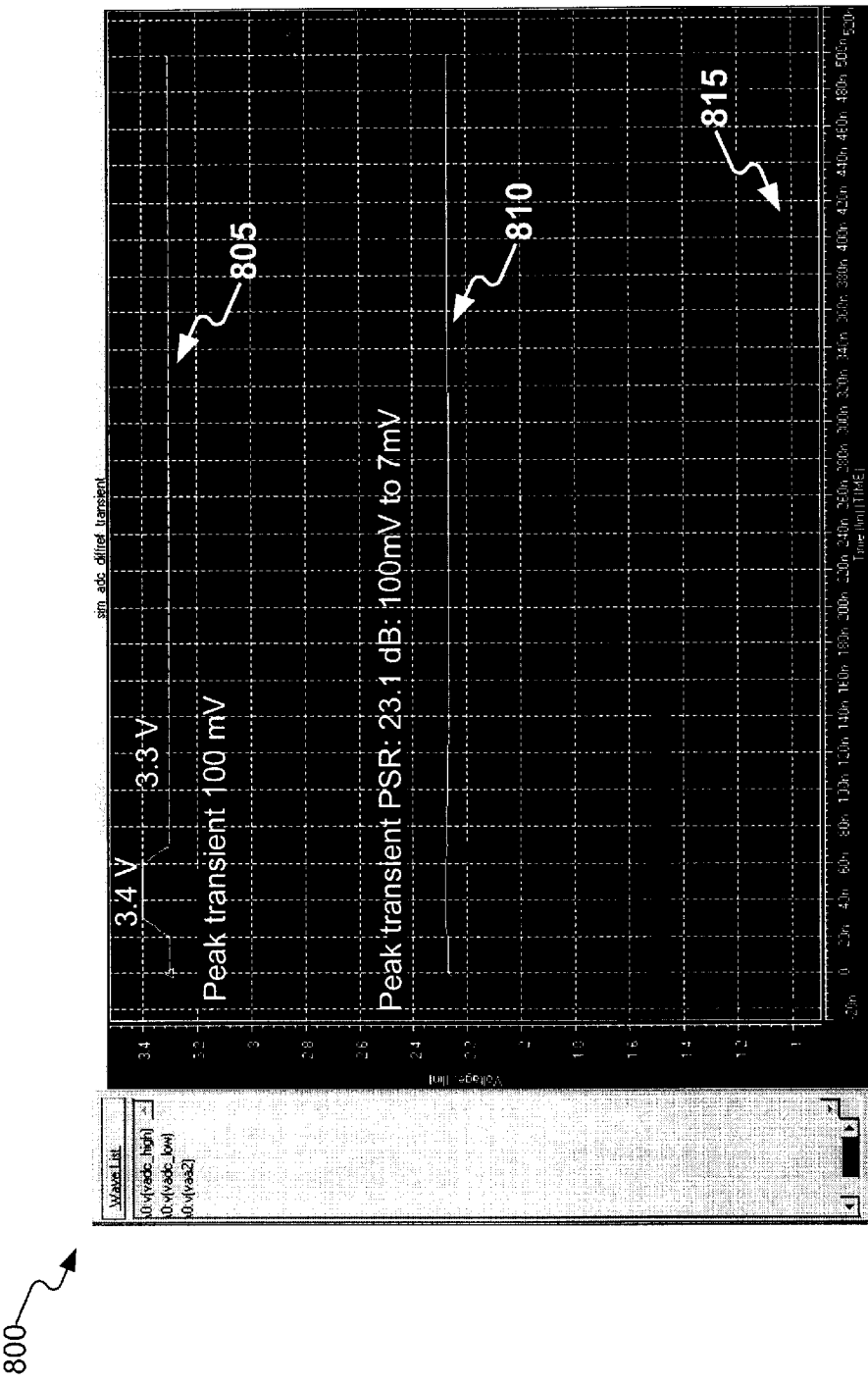
FIG. 8 is an illustration showing a graphical output display for a simulation of transient responses from a pulse on a power supply node in the example circuit of FIG. 6.

FIG. 8 is an illustration showing a graphical output display 800 for a simulation of transient responses from a pulse on a power supply node in the example circuit of FIG. 6. A pulse waveform 805 on the power supply node results in a high-side waveform 810 for the resistive reference ladder and a low-side waveform 815 for the resistive reference ladder. The peak power supply ripple rejection in the time domain is from 100 mV to 7 mV (23.1 dB). Thus, the new design 300 and circuit 400, from FIGS. 3 and 4 respectively, substantially improve the PSRR.

Various implementations of the systems and techniques described here may be realized in digital electronic circuitry, integrated circuitry, specially designed ASICs (application specific integrated circuits) or in computer hardware, firmware, software, or combinations thereof.

Other embodiments may be within the scope of the following claims.

What is claimed is:

1. A reference voltage circuit for an analog-to-digital converter, the circuit comprising:
   a resistive ladder having an even number of resistors and a node at a midpoint between the resistors; and
   a reference voltage source coupled to the node, wherein said reference voltage source comprises a regulated voltage source that will accept both input and output currents.

2. The circuit of claim 1, wherein the resistive ladder comprises four resistors.

3. The circuit of claim 1, wherein the reference voltage source differs from a common-mode voltage of the analog-to-digital converter by less than less than one half a least significant bit.

4. The circuit of claim 1, further comprising:
   a reference resistor coupled with the reference voltage source;
   a first voltage-controlled current source coupled with the reference resistor;
   a voltage regulator coupled with the first voltage-controlled current source; and
   a low voltage source coupled to the voltage regulator.

5. The circuit of claim 4, wherein the voltage regulator comprises an amplifier coupled in a feedback loop with the first voltage controlled current source.

6. The circuit of claim 4, further comprising a current mirror coupled with a power supply, the voltage regulator, and the resistive ladder, wherein the current mirror scales current in the resistive ladder by a factor of eight.

7. The circuit of claim 6, wherein resistance matching is provided between the reference resistor and a total combined series resistance of the resistive ladder.

8. A method, comprising:
   forming on a substrate, a resistive ladder having an even number of resistors and a midpoint between the resistors; and
   connecting a reference voltage source to the midpoint, wherein said reference voltage source comprises a regulated voltage source that will accept both input and output currents.

9. The method of claim 8, wherein the resistive ladder comprises eight resistors.

10. The method of claim 8, further comprising:
    forming a reference resistor on the substrate;
    forming a first voltage-controlled current source on the substrate;
    forming a voltage regulator on the substrate;
    connecting the reference resistor with the reference voltage source;
    connecting the first voltage-controlled current source with the reference resistor; and
    connecting the voltage regulator with the first voltage-controlled current source and with a low voltage source.

11. The method of claim 10, wherein the voltage regulator comprises an amplifier, the method further comprising connecting the amplifier in a feedback loop with the first voltage-controlled current source.

12. An analog-to-digital converter, comprising:
    a resistive ladder having an even number of resistors and a midpoint between the resistors; and a reference voltage source coupled to the midpoint, wherein the reference voltage source differs from a common-mode voltage of the analog-to digital converter by less than one-half a least significant bit.

13. The converter of claim 12, wherein the resistive ladder comprises four resistors.

14. The converter of claim 12, wherein the reference voltage source comprises a regulated voltage source that will accept both input and output currents.

15. The converter of claim 14, further comprising:
    a reference resistor coupled with the reference voltage source;
    a first voltage-controlled current source coupled with the reference resistor;
    a voltage regulator coupled with the first voltage-controlled current source; and
    a low-voltage source coupled to the voltage regulator.

16. The converter of claim 15, wherein the voltage regulator comprises an amplifier coupled in a feedback loop with the first voltage controlled current source.

17. The converter of claim 15, further comprising a current mirror coupled with a power supply, the voltage regulator, and the resistive ladder, wherein the current mirror scales current in the resistive ladder by a factor of eight.

18. The converter of claim 17, wherein resistance matching is provided between the reference resistor and a total combined series resistance of the resistive ladder.

19. The converter of claim 18, further comprising:
    a plurality of comparators coupled with the resistive ladder; and
    a digital output encoder.

20. A method, comprising:
    providing a power source for a circuit;
    providing a ground for the circuit; and
    applying a reference voltage to a midpoint of a resistive ladder in a circuit to create a plurality of reference voltages for an analog-to-digital converter, wherein the reference voltage differs from a common-mode voltage of the analog-to-digital converter by less that one-half a least significant bit.

21. The method of claim 20, wherein applying a reference voltage to a midpoint of a resistive ladder comprises applying a regulated voltage through a voltage source that will accept both input and output currents.

22. The method of claim 21, further comprising providing an analog input to a plurality of comparators coupled with the resistive ladder to generate a digital output.

* * * * *

UNITED STATES PATENT AND TRADEMARK OFFICE
CERTIFICATE OF CORRECTION

PATENT NO.     : 6,600,439 B1
DATED          : July 29, 2003
INVENTOR(S)    : Per O. Pahr It is certified that error appears in the above-identified patent and that said Letters Patent is hereby corrected as shown below:

Column 1,
Line 35, "AMP," should read -- $AMP_1$ --.

Column 2,
Line 27, "-td-" should read -- -to- --.

Column 3,
Line 9, "VDD" should read -- $V_{DD}$ --.

Column 4,
Line 10, "$R_{LADDRR}$" should read -- $R_{LADDER}$ --.
Line 15, "VREF" should read -- $V_{REF}$ --.
Line 54, "2.24" should read -- 2.29 --.

Signed and Sealed this

Tenth Day of February, 2004

JON W. DUDAS
*Acting Director of the United States Patent and Trademark Office*